United States Patent
Ito et al.

(10) Patent No.: US 8,878,077 B2
(45) Date of Patent: Nov. 4, 2014

(54) WIRING SUBSTRATE AND METHOD OF MANUFACTURING THE SAME

(75) Inventors: Takashi Ito, Nagano (JP); Tomoo Yamasaki, Nagano (JP); Yuta Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 342 days.

(21) Appl. No.: 13/279,501

(22) Filed: Oct. 24, 2011

(65) Prior Publication Data

US 2012/0103667 A1    May 3, 2012

(30) Foreign Application Priority Data

Oct. 28, 2010  (JP) ................... 2010-241744

(51) Int. Cl.
| | |
|---|---|
| *H05K 1/11* | (2006.01) |
| *H05K 1/09* | (2006.01) |
| *H05K 3/46* | (2006.01) |
| *H05K 3/22* | (2006.01) |
| *H05K 3/10* | (2006.01) |
| *H01L 21/48* | (2006.01) |

(52) U.S. Cl.
CPC .......... *H05K 3/4652* (2013.01); *H01L 21/4857* (2013.01); *H05K 3/108* (2013.01); *H01L 21/486* (2013.01)
USPC .......................................... 174/264; 174/257

(58) Field of Classification Search
CPC ............. H05K 3/4642; H05K 3/0038; H05K 2201/09863; H01L 2224/82039
USPC .................................................. 174/257, 264
See application file for complete search history.

(56) References Cited

U.S. PATENT DOCUMENTS

| | | | | |
|---|---|---|---|---|
| 4,969,979 | A | * | 11/1990 | Appelt et al. ................. 205/131 |
| 6,326,559 | B1 | * | 12/2001 | Yoshioka et al. ............. 174/261 |
| 6,590,165 | B1 | * | 7/2003 | Takada et al. ................. 174/266 |

(Continued)

FOREIGN PATENT DOCUMENTS

| | | |
|---|---|---|
| JP | 11-87931 | 3/1999 |
| JP | 2002-261447 | 9/2002 |

(Continued)

OTHER PUBLICATIONS

Japanese Office Action dated Feb. 12, 2014, in the corresponding Japanese patent application No. 2010-241744, with English translation.

*Primary Examiner* — Jeremy C Norris
*Assistant Examiner* — Nathan Milakovich
(74) *Attorney, Agent, or Firm* — Kratz, Quintos & Hanson, LLP

(57) ABSTRACT

A method of manufacturing a wiring substrate, includes forming a laminated body in which a nickel copper alloy layer is formed via an insulating resin layer, on a first wiring layer, forming a via hole reaching the first wiring layer in the nickel copper alloy layer and the insulating resin layer, applying a desmear process to an inside of the via hole, forming a seed layer on the nickel copper alloy layer and an inner surface of the via hole, forming a plating resist in which an opening portion is provided on a part containing the via hole, forming a metal plating layer in the opening portion in the plating resist by an electroplating, removing the plating resist, and forming a second wiring layer by etching the seed layer and the nickel copper alloy layer while using the metal plating layer as a mask.

2 Claims, 8 Drawing Sheets

(56) References Cited

U.S. PATENT DOCUMENTS

| | | | |
|---|---|---|---|
| 6,591,495 B2* | 7/2003 | Hirose et al. | 29/846 |
| 6,609,297 B1* | 8/2003 | Hiramatsu et al. | 29/852 |
| 6,671,949 B2* | 1/2004 | Yoshioka et al. | 29/852 |
| 7,140,103 B2* | 11/2006 | Gaku et al. | 29/852 |
| 7,230,188 B1* | 6/2007 | En et al. | 174/257 |
| 7,415,761 B2* | 8/2008 | Hirose et al. | 29/852 |
| 7,552,531 B2* | 6/2009 | Takada et al. | 29/852 |
| 7,827,680 B2* | 11/2010 | En et al. | 29/831 |
| 8,065,794 B2* | 11/2011 | En et al. | 29/847 |
| 8,288,659 B2* | 10/2012 | Yamasaki | 174/259 |
| 8,296,944 B2* | 10/2012 | Chang et al. | 29/852 |
| 2007/0277373 A1* | 12/2007 | Takai et al. | 29/829 |
| 2008/0107863 A1* | 5/2008 | Ikeda et al. | 428/137 |
| 2008/0149379 A1* | 6/2008 | Nagase et al. | 174/260 |
| 2008/0202803 A1* | 8/2008 | Nagase et al. | 174/262 |
| 2008/0264684 A1* | 10/2008 | Kang et al. | 174/262 |
| 2009/0200072 A1* | 8/2009 | Yamasaki | 174/259 |
| 2010/0270646 A1* | 10/2010 | Chan et al. | 257/532 |
| 2011/0101532 A1* | 5/2011 | Pohl et al. | 257/758 |
| 2011/0114372 A1* | 5/2011 | Kato et al. | 174/256 |
| 2011/0284496 A1* | 11/2011 | Yamanishi et al. | 216/20 |
| 2012/0085730 A1* | 4/2012 | Sasaki et al. | 216/13 |
| 2012/0234584 A1* | 9/2012 | Ejiri et al. | 174/257 |
| 2012/0247814 A1* | 10/2012 | Shimizu et al. | 174/251 |
| 2012/0247818 A1* | 10/2012 | Adachi et al. | 174/257 |
| 2012/0327626 A1* | 12/2012 | Horiuchi et al. | 361/783 |
| 2013/0118794 A1* | 5/2013 | Tseng | 174/266 |
| 2013/0302938 A1* | 11/2013 | Sato et al. | 438/104 |

FOREIGN PATENT DOCUMENTS

| | | |
|---|---|---|
| JP | 2003-283135 | 10/2003 |
| JP | 2004-235202 | 8/2004 |
| JP | 2009-188324 | 8/2009 |
| JP | 2010-199616 | 9/2010 |

* cited by examiner the case including extended wiring portion
(partial enlarged plan view (1))

the case of island-like pad portion
(partial enlarged plan view (2))

(partial enlarged sectional view)

Ni content rate dependence property of peeling strength in Ni-Cu alloy layer

Ni content rate dependence property of etching rate in Ni-Cu alloy layer

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2010-241744, filed on Oct. 28, 2010; the entire contents of which are incorporated herein by reference.

FIELD

It is related to a wiring substrate on which an electronic component such as a semiconductor chip, or the like is mounted, and a method of manufacturing the same.

BACKGROUND

In the prior art, there is the wiring substrate on which an electronic component such as a semiconductor chip, or the like is mounted. In an example of such wiring substrate, the build-up wiring is formed on one surface or both surfaces of the core substrate by the semi-additive process, or the like.

In recent years, with the enhancement in performances of an electronic component such as a semiconductor chip, or the like, a narrower pitch between wiring layers in the wiring substrate is advanced.

A related art is disclosed in Japanese Laid-open Patent Publication No. 11-87931.

In the formation of the wirings by using the semi-additive process, as a surface roughness of the insulating resin layer is increased, adhesion of the wiring layers formed on the insulating resin layer can be improved, nevertheless unevenness on the insulating resin layer brings about an obstacle upon forming the fine wiring layers. When the unevenness is produced on a surface of the insulating resin layer, an electric short-circuit due to the residue at the time in removing a seed layer occurs easily between the wirings.

SUMMARY

According to one aspect discussed herein, there is provided a method of manufacturing a wiring substrate, which includes forming a laminated body in which a nickel copper alloy layer is formed via an insulating resin layer, on a first wiring layer, forming a via hole reaching the first wiring layer, by processing the nickel copper alloy layer and the insulating resin layer by a laser, applying a desmear process to an inside of the via hole, forming a seed layer on the nickel copper alloy layer and an inner surface of the via hole, forming a plating resist in which an opening portion is provided on a part containing the via hole, forming a metal plating layer in the via hole and the opening portion in the plating resist, by an electroplating utilizing the seed layer as a plating power feeding path, removing the plating resist, and forming a second wiring layer connected to the first wiring layer via the via hole, by etching the seed layer and the nickel copper alloy layer while using the metal plating layer as a mask.

Also, according to another aspect discussed herein, there is provided a wiring substrate, which includes a first wiring layer, an insulating resin layer formed on the first wiring layer, a via hole formed in the insulating resin layer, and reaching the first wiring layer, and a second wiring layer including a nickel copper alloy layer arranged in a part except the via hole and formed on the insulating resin layer located outside an outer periphery of the via hole, a seed layer extended from an inner surface of the via hole onto the nickel copper alloy layer, and a metal plating layer formed on the seed layer in a state that the metal plating layer is filled in the via hole, wherein the nickel copper alloy layer is formed on the insulating resin layer with a predetermined pattern.

DESCRIPTION OF EMBODIMENTS

An embodiment of the present invention will be explained with reference to the accompanying drawings hereinafter.

Prior to the explanation of an embodiment, the related art to be set forth as a basis (preliminary matter) will be explained hereunder.

Figure 1A:
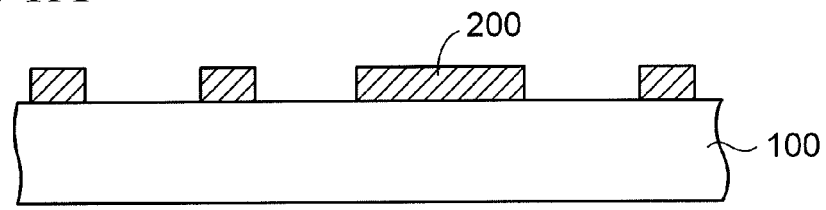
FIGS. 1A to 1D are sectional views (#1) depicting a method of manufacturing a wiring substrate in the related art.
Figure 1B:
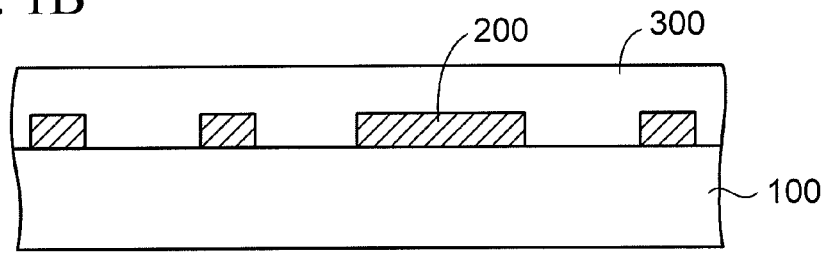

In a method of manufacturing a wiring substrate in the related art, as depicted in FIG. 1A, first, a first wiring layer 200 made of copper is formed on a core substrate 100. Then, as depicted in FIG. 1B, an insulating resin layer 300 covering the first wiring layer 200 is formed on the core substrate 100.

Figure 1C:
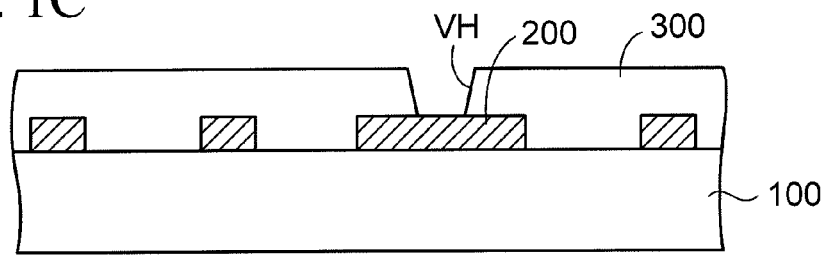

Then, as depicted in FIG. 1C, the first wiring layer 200 is processed by the laser. Thus, a via hole VH reaching a connection part of the first wiring layer 200 is formed.

Figure 1D:
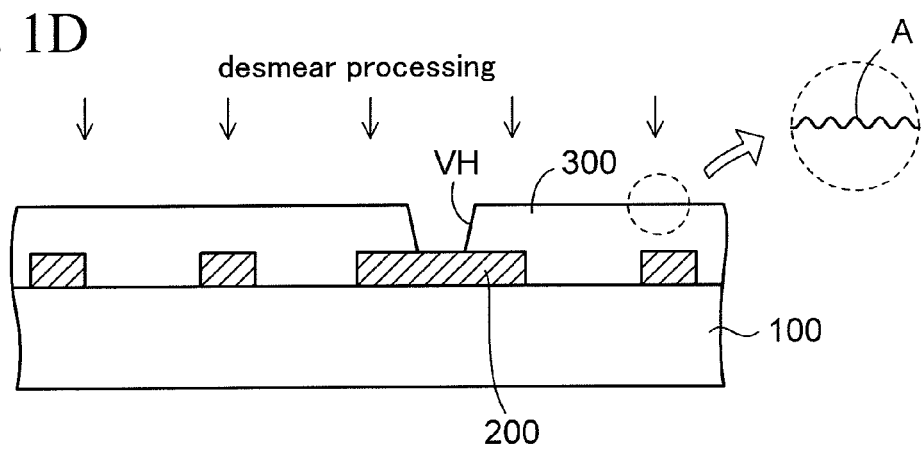

Then, as depicted in FIG. 1D, the desmear process is applied to the inside of the via hole VH by using the permanganate process, or the like. By this matter, a resin smear remained in the inside of the via hole VH, or the like are removed, and thus the inside of the via hole VH is cleaned. A surface of the insulating resin layer 300 is etched simultaneously by the desmear process to constitute a roughened surface A. A surface roughness (Ra) of the roughened surface A of the insulating resin layer 300 is set to 300 nm or more.

Figure 2A:
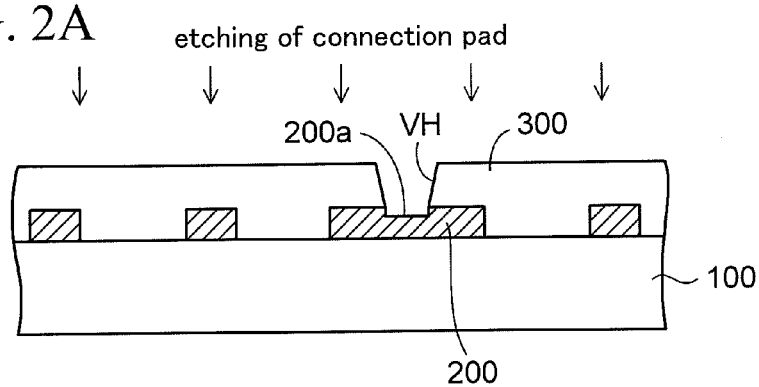
FIGS. 2A to 2D are sectional views (#2) depicting the method of manufacturing the wiring substrate in the related art.

Then, as depicted in FIG. 2A, the connection part (copper) of the first wiring layer 200 exposed in the inside of the via hole VH is etched by a sulfuric acid series solution from the surface to a depth of about 1 μm. Accordingly, a concave portion 200a is formed in the first wiring layer 200 at a bottom part of the via hole VH.

Figure 2B:
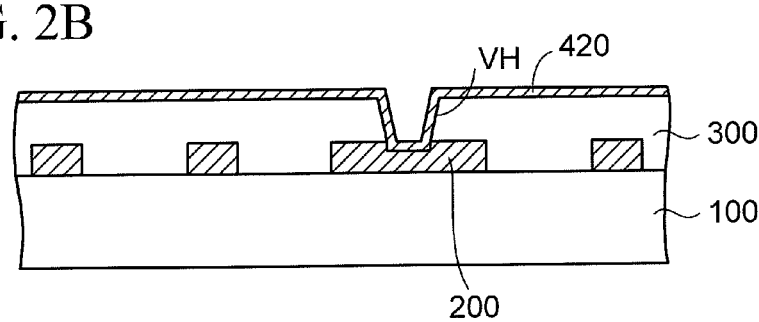
Figure 2C:
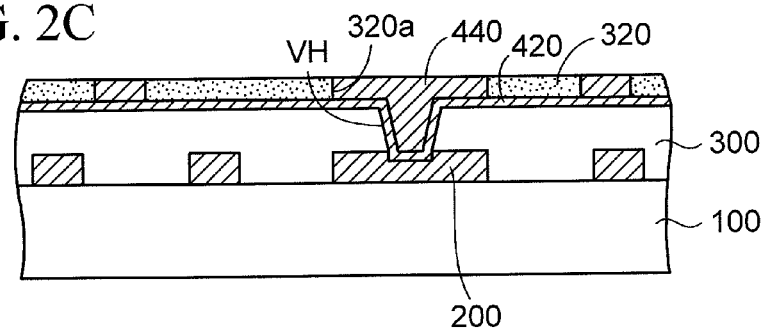

Then, as depicted in FIG. 2B, a seed layer 420 made of copper is formed on the insulating resin layer 300 and the inner surface of the via hole VH by the electroless plating. Then, as depicted in FIG. 2C, a plating resist 320 in which an opening portion 320a is provided in the part where the second wiring layer is arranged is formed on the seed layer 420. Then, a metal plating layer 440 made of copper is formed in the opening portion 320a of the plating resist 320 by the electric plating utilizing the seed layer 420 as a plating power feeding path.

Figure 2D:
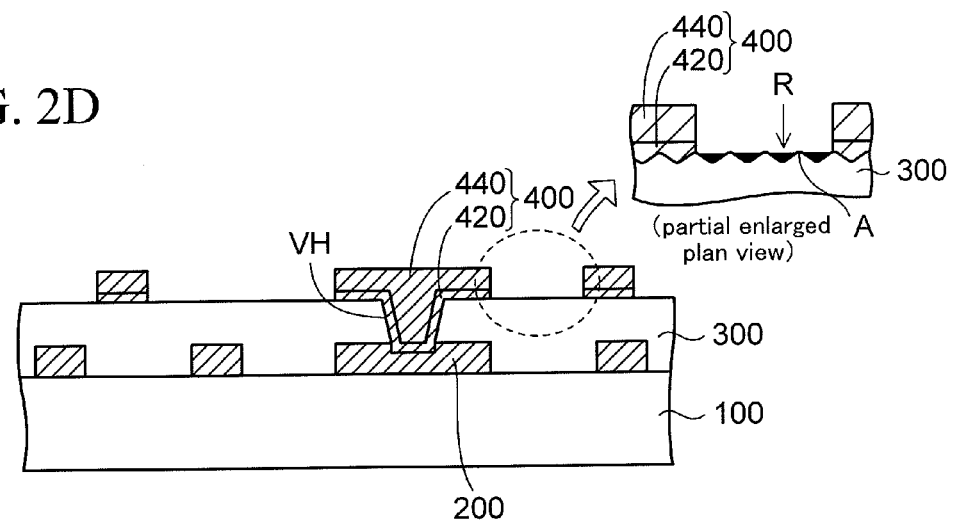

Then, as depicted in FIG. 2D, the plating resist 320 is removed. Then, the seed layer 420 is etched by using the metal plating layer 440 as a mask. By this matter, a second wiring layer 400 formed by the seed layer 420 and the metal plating layer 440 is obtained on the insulating resin layer 300. The second wiring layer 400 is connected electrically the connection part of the first wiring layer 200 via the via hole VH (via conductor).

At this time, as depicted in a partial enlarged view of FIG. 2D, the surface of the insulating resin layer 300 constitutes the roughened surface A, and the relatively large unevenness is produced. Therefore, when the seed layer 420 is etched, an etching residue R is easily produced on the roughened surface A, and an electric short-circuit between the wirings is easily brought about.

Also, when an extent of over-etching is increased in order to remove completely the etching residue R of the seed layer 420, in the case that specially fine patterns are used, in some cases the pattern jump is caused due to the side etching, and also some of patterns may disappear.

Further, the plating resist 320 is formed on the seed layer 420, which is formed on the roughened surface A (unevenness) of the insulating resin layer 300, by using the photolithography. Therefore, owing to the influence of the unevenness of the underlying layer, it becomes difficult to form the plating resist 320 for forming the fine pattern wiring with high precision.

An embodiment explained hereunder can solve the disadvantages mentioned above.

Embodiment

Figure 4A:
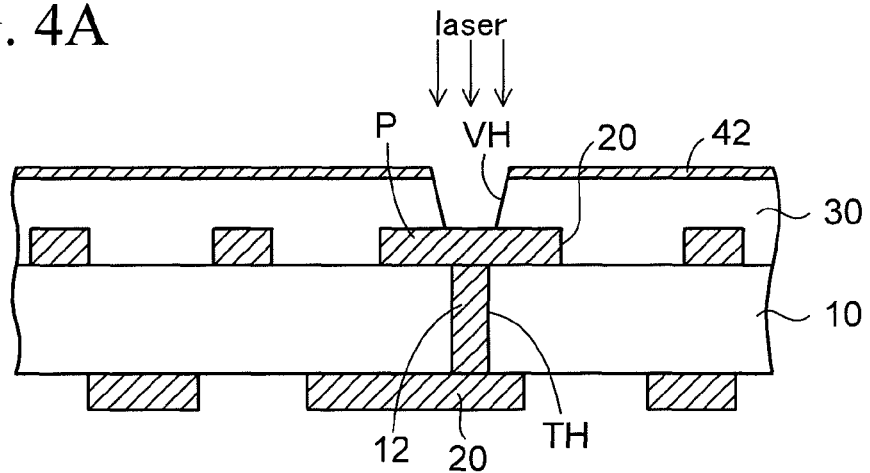
FIGS. 4A to 4C are sectional views (#2) depicting the method of manufacturing the wiring substrate according to the embodiment.
Figure 4B:
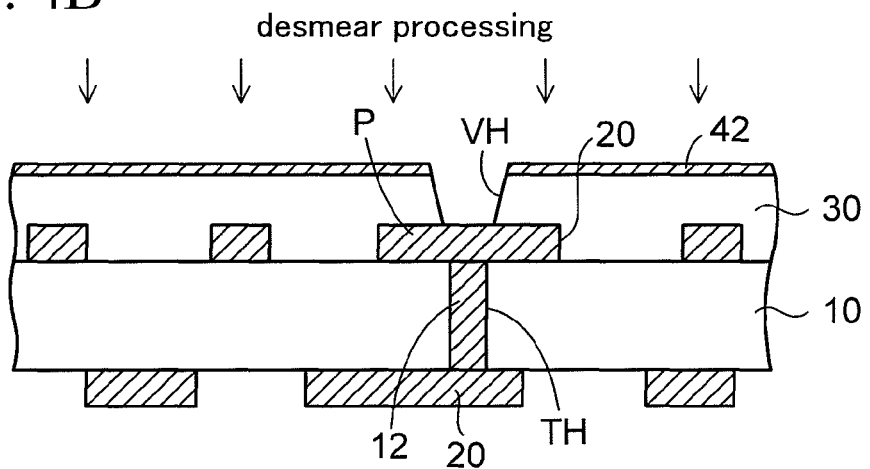
Figure 4C:
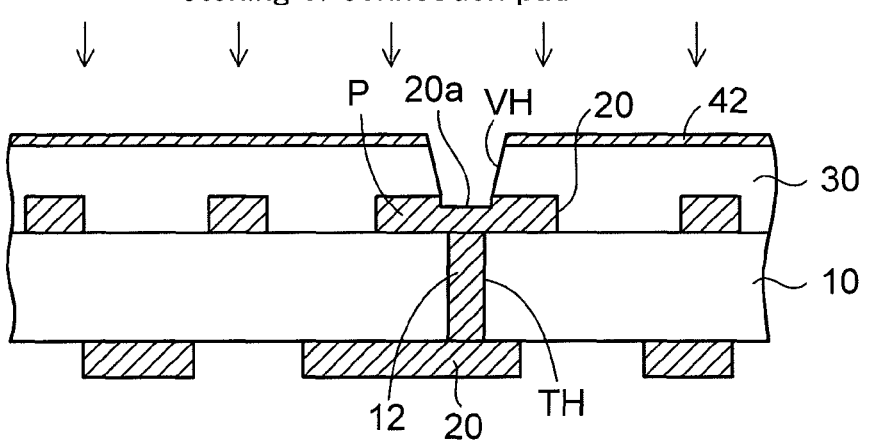
Figure 5A:
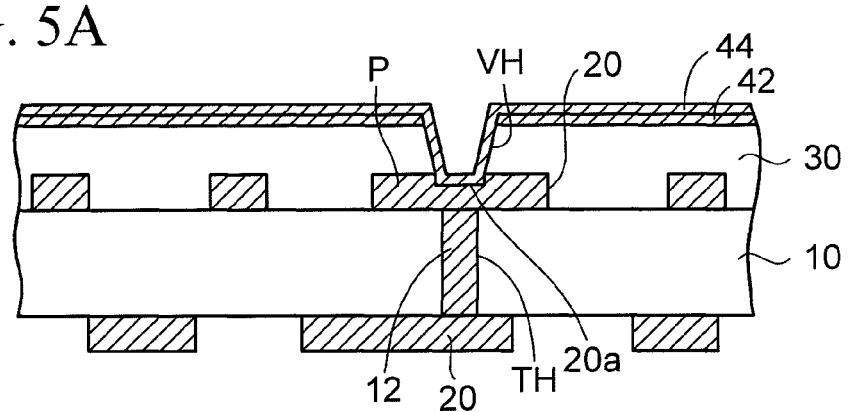
FIGS. 5A to 5C are sectional views (#3) depicting the method of manufacturing the wiring substrate according to the embodiment.
Figure 5B:
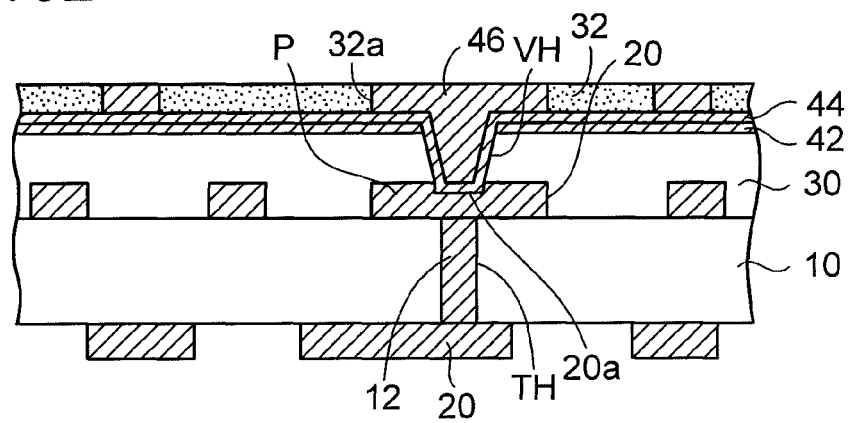
Figure 5C:
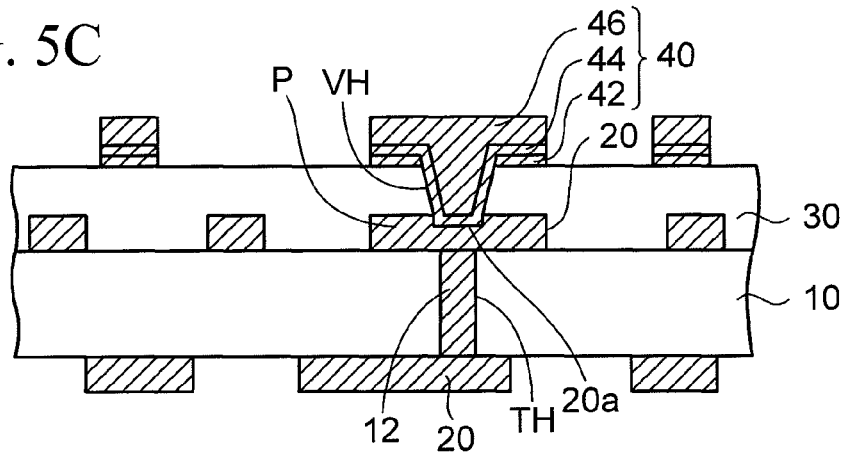
Figure 6:
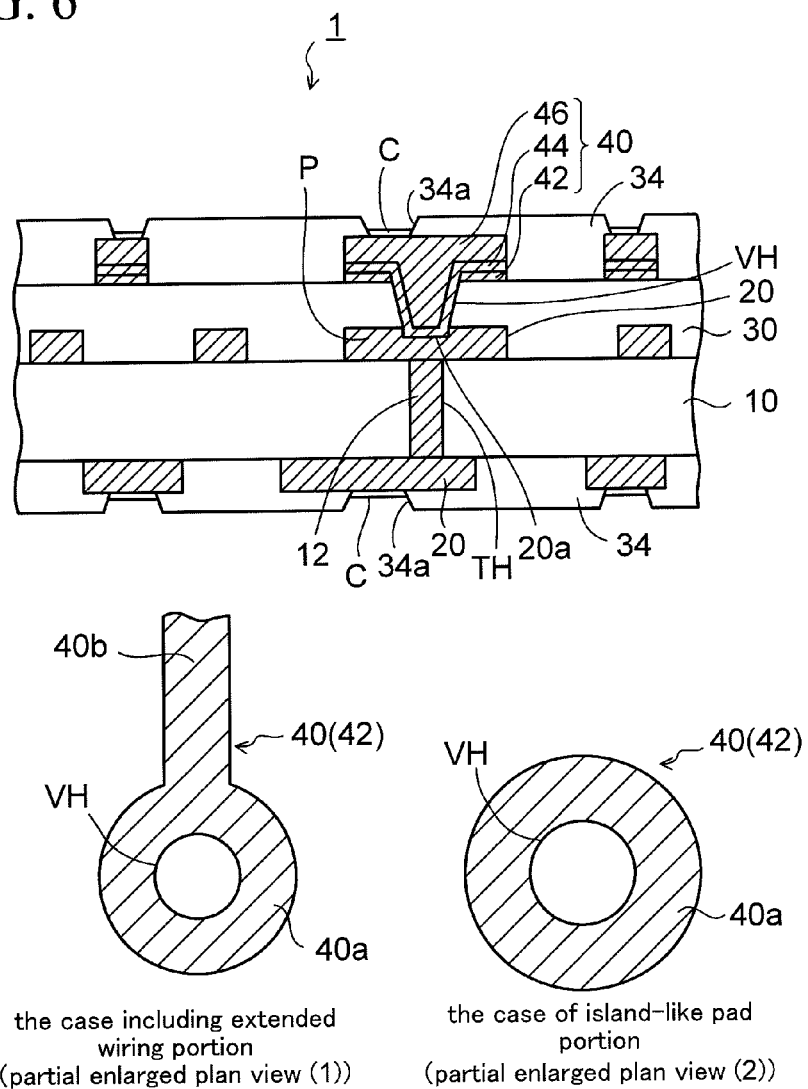
FIG. 6 is a sectional view depicting a wiring substrate according to the embodiment.
Figure 6:
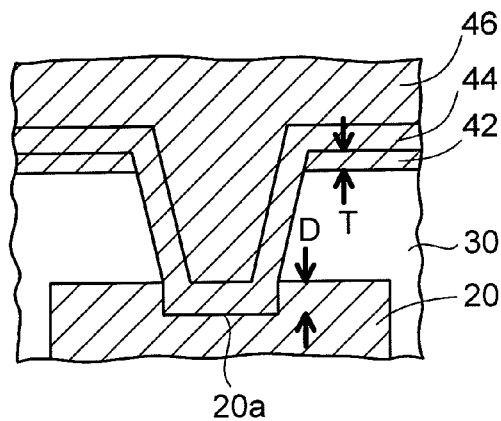

FIG. 3A to FIG. 5C are sectional views depicting a method of manufacturing a wiring substrate according to an embodiment, and FIG. 6 is a sectional view depicting a wiring substrate according to the embodiment.

Figure 3A:
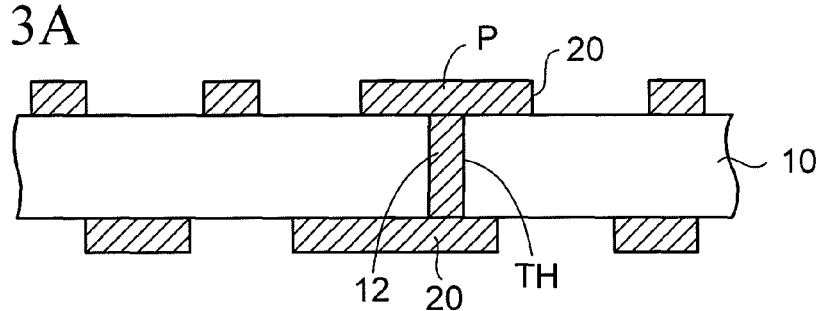
FIGS. 3A to 3C are sectional views (#1) depicting a method of manufacturing a wiring substrate according to an embodiment.

In the method of manufacturing the wiring substrate according to the embodiment, as depicted in FIG. 3A, first, a core substrate 10 in which a first wiring layer 20 is formed on both surface sides respectively is prepared. A through hole TH which penetrates the substrate in the thickness direction is provided in the core substrate 10, and a penetration electrode 12 is filled in the through hole TH. The first wiring layers 20 formed on both surface sides are connected mutually via the penetration electrode 12. In the first wiring layers 20 located on the upper surface side, a connection pad P thereof is depicted.

Alternatively, the first wiring layers 20 formed on both surface sides may be connected mutually via a through hole plating layer formed on an inner wall of the through hole TH, and a resin may be filled in a remained hole in the through hole TH.

The core substrate 10 is formed by insulating material such as a glass epoxy resin or the like, silicon, or the like. In the case that a silicon substrate is used as the core substrate 10, an insulating layer such as a silicon oxide layer, or the like is formed on both surface sides of the core substrate 10 and the inner surface of the through hole TH.

A build-up wiring connected to the first wiring layer 20 is formed on both surface sides of the core substrate 10 respectively. In the present embodiment, the build-up wiring is formed only on the upper surface side of the core substrate 10.

Figure 3B:
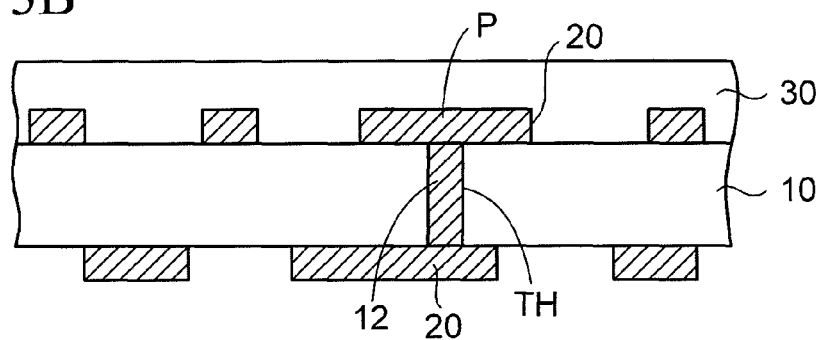

Then, as depicted in FIG. 3B, a resin film made of epoxy, polyimide, or the like is pasted onto the core substrate 10. Thus, an insulating resin layer 30 covering the first wiring layer 20 is formed.

Figure 3C:
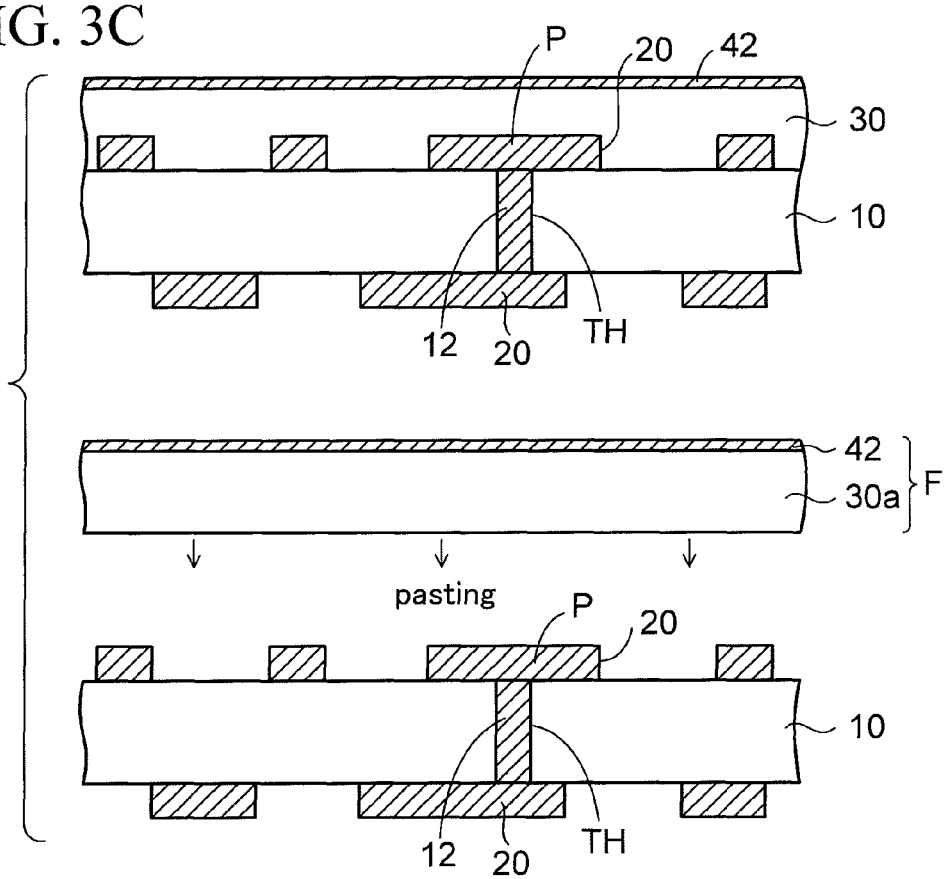

Then, as depicted in an upper view of FIG. 3C, a nickel (Ni) copper (Cu) alloy layer 42 is formed on the insulating resin layer 30 by the sputter method using a Ni—Cu composite target. A thickness of the Ni—Cu alloy layer 42 is set in the range from 200 to 1000 nm (preferably about 500 nm).

As described later, the Ni—Cu alloy layer functions as a protection layer for preventing such an event that the surface of the insulating resin layer 30 is etched to produce unevenness when the desmear process is applied to the inside of the via hole, and also functions as an adhesion layer for forming the wiring layer on the smooth insulating resin layer 30 with good adhesion.

Accordingly, the desmear process is not applied to the surface of the insulating resin layer 30. Therefore, the surface roughness (Ra) of the insulating resin layer 30 is 10 to 200 nm, and a smooth state is maintained.

Figure 8:
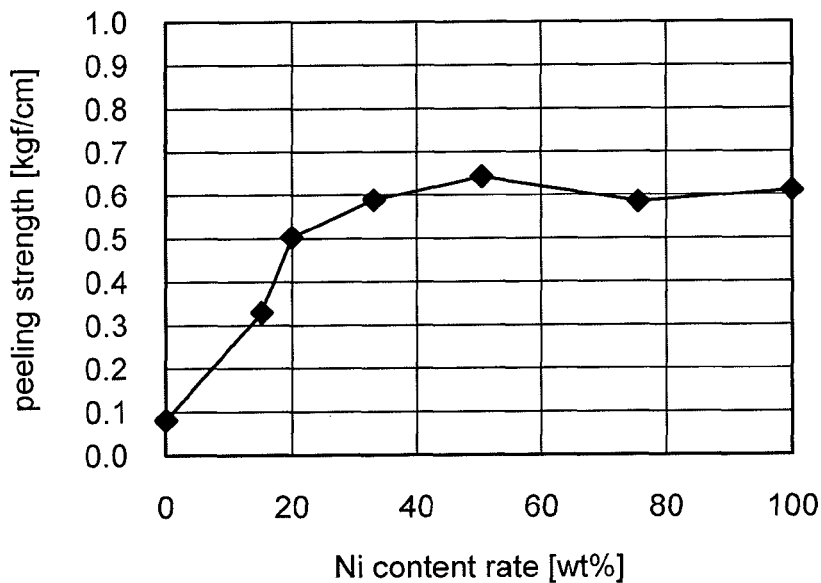
FIG. 8 is a graph depicting a Ni content rate dependence property of peeling strength in a Ni—Cu alloy layer.

In FIG. 8, a Ni content rate dependence property of peeling strength is depicted when the Ni—Cu alloy layer 42 is formed on the insulating resin layer 30 by the sputter method. In the Cu layer containing no Ni (Ni content: 0 wt %), the peeling strength is about 0.08 kgf/cm, and thus sufficient adhesion with the insulating resin layer 30 cannot be obtained.

However, when containing the Ni in the Cu layer gradually, the peeling strength is increased to about 0.32 kgf/cm at the Ni content rate: about 18 wt %. Further, when a range of the Ni content rate is 20 to 100 wt %, the peeling strength is increased to 0.5 to 0.65 kgf/cm. It is appreciated that the sufficient adhesion with the insulating resin layer 30 can be obtained by containing the Ni in the Cu layer.

As described above, the sufficient adhesion cannot be obtained when the Cu layer containing no Ni is formed by the sputter method on the insulating resin layer 30 whose surface is smooth, nevertheless the sufficient adhesion can be obtained by containing the Ni in the Cu layer.

Here, when the Ni—Cu alloy layer 42 is formed on the insulating resin layer 30 by the vapor deposition method instead of the sputter method, similarly the sufficient adhesion with the insulating resin layer 30 can be obtained.

Alternatively, as depicted in the lower view of FIG. 3C, a film with Ni—Cu alloy layer F may be prepared by forming the Ni—Cu alloy layer 42 in advance on a resin film 30a by means of the sputter method or the vapor deposition method, and the surface of the resin film 30a of the film with Ni—Cu alloy layer F may be pasted onto the core substrate 10. In this case, the identical structure with that depicted in the upper view of FIG. 3C can be also obtained.

In this manner, it may be performed such that a laminated body in which the Ni—Cu alloy layer is formed via the insulating resin layer 30, is formed on the first wiring layer 20.

Then, as depicted in FIG. 4A, the Ni—Cu alloy layer 42 and the insulating resin layer 30 are processed in the depth direction by the $CO_2$ laser. Thus, a via hole VH reaching the connection pad P of the first wiring layer 20 is formed.

The Ni—Cu alloy layer 42 has such a property that it is more easily processed by using the laser than the Cu layer, and processing by the laser is made easy as its thickness is made thin. Also, the Ni—Cu alloy layer 42 formed by the sputter method or the vapor deposition method can be set to thin film whose thickness is 1000 nm or less. As a result, the workability by the laser is improved, and thus improvement in productivity and yield can be achieved.

When performing the laser processing, it is necessary to form the Ni—Cu alloy layer 42 as the protection layer as thin as possible. In addition to this, when etching the first wiring layer 20 in the via hole, described later, it is necessary that the Ni—Cu alloy layer 42 (the protection layer) does not disappear.

As described later, an etching rate of the Ni—Cu alloy layer 42 (the protection layer) is lower than that of the copper. Therefore, the Ni—Cu alloy layer 42 can be formed more thinly than a depth of the concave portion produced at the time of etching the first wiring layer 20.

Here, unlike the present embodiment, the case that the protection layer is formed by the identical material with the first wiring layer 20 instead of the Ni—Cu alloy layer 42 may be considered. In such case, in order to still leave as the protection layer after the first wiring layer 20 is etched, it is necessary that the protection layer is formed more thickly than a depth of the concave portion of the first wiring layer 20. Hence, it is possible that any problem may arise when applying the laser processing.

Then, as depicted in FIG. 4B, the desmear process is applied to the inside of the via hole VH by using the wet process such as the permanganate process, or the like. By this matter, a resin smear remaining in the inside of the via hole VH, etc. are removed, and the inside of the via hole VH is cleaned.

At this time, the Ni—Cu alloy layer 42 is hardly etched by the desmear process such as the permanganate process, or the like, and the insulating resin layer 30 is protected with the Ni—Cu alloy layer 42. Therefore, the surface of the insulating resin layer 30 is never roughened by the desmear process. As a result, the surface of the insulating resin layer 30 can be maintained in a smooth state (surface roughness (Ra): 10 to 200 nm).

As the desmear process, the wet process such as the permanganate process, or the like is illustrated. But this desmear process may be performed by using the plasma (the dry process) of a gas including a fluorine atom such as $CF_4/O_2$ series, or the like. Also in the desmear process using the dry process, the Ni—Cu alloy layer 42 is hardly etched, and the insulating resin layer 30 is protected with the Ni—Cu alloy layer 42. Therefore, the surface of the insulating resin layer 30 is never roughened.

Then, as depicted in FIG. 4C, in order to ensure the conduction at the bottom part of the via hole VH, the surface of the connection pad P (Cu) exposed in the via hole VH is etched by using a mixed solution of sulfuric acid ($H_2SO_4$) and hydrogen peroxide ($H_2O_2$) (referred to as "sulfuric acid/hydrogen peroxide mixture" hereinafter). Thus, a concave portion 20a is formed in the first wiring layer 20. At this time, it is set to the conditions that the connection pad P is etched up to about 1000 nm in the depth direction, thereby a copper oxide on the surface of the connection pad P is removed.

An etching rate of the Ni—Cu alloy layer 42 by using the sulfuric acid/hydrogen peroxide mixture can be set to about one-third (⅓) of an etching rate of the Cu layer. Accordingly, in the case that the connection pad P (Cu) is etched by a thickness of 1000 nm, when a thickness of the Ni—Cu alloy layer 42 is set to 500 nm, the Ni—Cu alloy layer 42 is etched by about 330 nm and is left finally at a thickness of about 170 nm.

In this manner, in the present embodiment, a thickness of the Ni—Cu alloy layer 42, which is formed by the above step in FIG. 3C, can be set thinner than a depth of the concave portion 20a, which is formed on the connection pad P (the first wiring layer 20) in the via hole VH.

Figure 9:
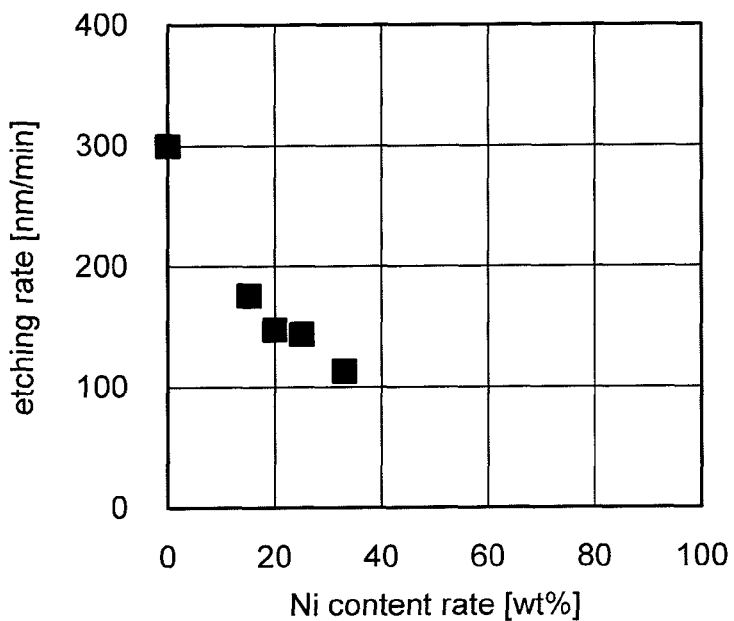
FIG. 9 is a graph depicting a Ni content rate dependence property of an etching rate in the Ni—Cu alloy layer.

In FIG. 9, a Ni content rate dependence property of an etching rate in the Ni—Cu alloy layer by using the sulfuric acid/hydrogen peroxide mixture is depicted. In the Cu layer containing no Ni (Ni content: 0 wt %), an etching rate by sulfuric acid/hydrogen peroxide mixture is about 300 nm/min.

In contrast, when containing the Ni in the Cu layer gradually, it is appreciated that an etching rate is decreased. In the Ni content rate is about 15 wt %, an etching rate is decreased to almost 180 nm/min, and in the Ni content rate is about 35 wt %, an etching rate is decreased to almost 110 nm/min (almost 37% of the etching rate of the Cu layer). Then, when the Ni content rate is further increased, an etching rate of the Ni—Cu alloy layer is decreased to about one-third (⅓) of the etching rate of the Cu layer.

When the connection pad P (Cu) is etched by the sulfuric acid/hydrogen peroxide mixture, a thickness of the Ni—Cu alloy layer 42 may be set such that the Ni—Cu alloy layer 42 still remains on the insulating resin layer 30. Accordingly, the interface with good adhesion between the insulating resin layer 30 and the Ni—Cu alloy layer 42 can be ensured.

In this manner, the Ni—Cu alloy layer 42 has such a characteristic that, when it is etched by the sulfuric acid/hydrogen peroxide mixture, its etching rate is lower than an etching rate of the Cu layer. And, an etching rate of the Ni—Cu alloy layer 42 can be finely adjusted by adjusting the Ni content rate.

By this matter, as described above, when the connection pad P (Cu) is etched, the Ni—Cu alloy layer 42 can be left, and as described later, the Ni—Cu alloy layer 42 can be etched simultaneously when the seed layer (Cu) is etched.

From such viewpoints, the Ni content rate of the Ni—Cu alloy layer 42 should be set in a range from 15 to 75 wt %, and preferably from 20 to 50 wt %. As a result, an etching rate of the Ni—Cu alloy layer 42 by the sulfuric acid/hydrogen peroxide mixture can be set lower than an etching rate of the Cu layer, and set to the extent that the Ni—Cu alloy layer can be etched at the practical level.

Here, in the case that the conduction at the bottom part of the via hole VH does not become the problem, the step of etching the connection pad P in the via hole VH may be omitted.

Then, as depicted in FIG. 5A, a seed layer is formed on the Ni—Cu alloy layer 42 and the inner surface of the via hole VH by the sputter method. The seed layer 44 is formed of copper, and its thickness is about 50 to 1000 nm.

In view of a diameter and a shape of the via hole VH, it is desirable that a thickness of the seed layer 44 should be set to the lowest limit that enables the seed layer 44 to cover the inner surface of the via hole VH certainly.

When the seed layer 44 is formed excessively thin, a step coverage of the seed layer cannot be obtained sufficiently in the via hole VH. Therefore, a defect such as a void, or the like is easy to occur when the electroplating is applied to the inside of the via hole VH in the semi-additive process. Conversely, the seed layer 44 is formed excessively thick, an etching shift is increased when the seed layer 44 is etched in the semi-additive process. Therefore, such etching shift acts as the disadvantageous when fine-pattern wiring is formed.

The seed layer 44 may be formed by the electroless plating, in addition to the sputter method.

At this time, as described above, the Ni—Cu alloy layer 42 has already been formed on the insulating resin layer 30 with good adhesive condition. Therefore, the seed layer 44 is formed on the insulating resin layer 30 via the Ni—Cu alloy layer 42 with good adhesion.

This is because, when the seed layer 44 is formed directly on the smooth insulating resin layer 30, sufficient adhesion between them cannot be achieved, but the seed layer 44 can be formed on the metal layer such as the Ni—Cu alloy layer 42 with good adhesion.

Then, as depicted in FIG. 5B, a plating resist 32 in which an opening portion 32a is provided in the part where the second wiring layer is arranged is formed on the seed layer 44 by the photolithography. As the method of forming the plating resist 32, either a dry film resist may be pasted or a liquid resist may be coated.

Then, a metal plating layer 46 made of copper, or the like is formed in the inside of the via hole VH and the opening portion 32a of the plating resist 32 by the electroplating utilizing the seed layer 44 as a plating power feeding path. A thickness of the metal plating layer 46 can be set arbitrarily such that a desired wiring resistance can be obtained. For example, such thickness may be set to about 10 μm. In the inside of the via hole VH, a metal plating is applied from the seed layer formed on the inner surface of the via hole VH toward the inner side, and thus the via conductor is filled in the via hole VH.

From such a viewpoint that the Ni—Cu alloy layer 42 formed under the seed layer 44 can be also utilized as a part of the seed, it is possible that the seed layer 44 is made thin.

Then, as depicted in FIG. 5C, the plating resist 32 is removed, and then the seed layer 44 (Cu) and the underlying Ni—Cu alloy layer 42 are removed by the wet etching while using the metal plating layer 46 as a mask. At this time, the sulfuric acid/hydrogen peroxide mixture is used as an etchant of the wet etching, and the seed layer 44 (Cu) and the underlying Ni—Cu alloy layer 42 are etched continuously by the sulfuric acid/hydrogen peroxide mixture.

As described above, an etching rate of the Ni—Cu alloy layer 42 by the sulfuric acid/hydrogen peroxide mixture is obtained at about one-third (⅓) of an etching rate of the seed layer 44 (Cu). Therefore, it is possible that the seed layer 44 (Cu) is etched by the sulfuric acid/hydrogen peroxide mixture and then the Ni—Cu alloy layer 42 is etched continuously by the same sulfuric acid/hydrogen peroxide mixture.

That is, in the batch type wet etching equipment, a plurality of core substrates 10 are dipped in the sulfuric acid/hydrogen peroxide mixture wet tub. Therefore, the seed layer 44 (Cu) and the Ni—Cu alloy layer 42 can be etched by collective process, and thus improvement of production efficiency can be achieved.

Accordingly, a second wiring layer 40 formed by the Ni—Cu alloy layer 42, the seed layer 44, and the metal plating layer 46 is obtained on the insulating resin layer 30. The second wiring layer 40 is connected electrically to the connection pad P of the first wiring layer 20 via the via hole VH (via conductor).

In the present embodiment, since the surface of the insulating resin layer 30 is smooth, fine resist patterns can be formed with high precision at the time when the plating resist 32 is formed by the photolithography in the semi-additive process.

Also, since the surface of the insulating resin layer 30 is smooth, residues are hardly produced at the time when the seed layer 44 and the Ni—Cu alloy layer 42 are etched by the semi-additive process. Therefore, the second wiring layers 40 having a narrow pitch can be formed with good yield.

Further, since respective thickness of the seed layer 44 and the Ni—Cu alloy layer 42 can be set relatively thin, an extent of side etching caused when these layers are etched can be suppressed. Therefore, a constriction shape, or the like can be improved, and the second wiring layers 40 with high reliability can be obtained.

Then, as depicted in FIG. 6, a solder resist 34 in which an opening portion 34a is provided on a connection part of the second wiring layers 40 is formed on the upper surface side of the core substrate 10. Then, a contact layer C formed of a Ni/Au plating layer, or the like is formed on the connection part of the second wiring layers 40.

Similarly, the solder resist 34 in which an opening portion 34a is provided on a connection part of the first wiring layer 20 is formed on the lower surface side of the core substrate 10. Then, the contact layer C formed of the Ni/Au plating layer, or the like is formed on the connection part of the first wiring layer 20.

With the above, a wiring substrate 1 of the present embodiment is obtained.

In the wiring substrate 1 in FIG. 6, one layer of build-up wiring is formed on the upper surface side of the core substrate 10 on both surface sides of which the first wiring layer 20 is formed respectively. In this case, n layers (n is an integer in excess of 1) of build-up wiring, which are connected to the first wiring layer 20, may be formed on both surface sides of the core substrate 10 respectively.

Also, besides the rigid substrate such as the insulating substrate, the silicon substrate, or the like, a flexible substrate may be used as the core substrate 10.

As described above, in the method of manufacturing the wiring substrate of the present embodiment, first, a laminated body in which the Ni—Cu alloy layer 42 is formed on the insulating resin layer 30 is formed on the first wiring layer 20. The Ni—Cu alloy layer 42 is formed on the insulating resin layer 30 in a good adhesive condition. Then, the Ni—Cu alloy layer 42 and the insulating resin layer 30 are processed by the laser. Thus, the via hole VH reaching the connection pad P of the first wiring layer 20 is formed.

Then, the inside of the via hole VH is cleaned by the desmear process. At this time, the insulating resin layer 30 is protected with the Ni—Cu alloy layer 42, therefore the surface of the insulating resin layer 30 is never roughened by the desmear process.

Then, the connection pad P (Cu) in the via hole VH is etched by the wet process. At this time, since an etching rate of the Ni—Cu alloy layer 42 is lower than that of the Cu layer, the Ni—Cu alloy layer 42 can be left as an adhesive layer on the insulating resin layer 30.

Then, the second wiring layer 40 connected to the connection pad P of the first wiring layer 20 via the via hole VH (via conductor) is formed by the semi-additive process. The second wiring layer 40 is formed by the Ni—Cu alloy layer 42, the seed layer 44, and the metal plating layer 46, and is formed on the insulating resin layer 30 in a good adhesive condition.

At this time, the Ni—Cu alloy layer 42 can be etched simultaneously by the etchant that is applied to the seed layer 44 (Cu). Therefore, there is no possibility that the employment of the Ni—Cu alloy layer 42 makes the process more complicated.

Also, the surface of the insulating resin layer 30 is still kept smoothly. Therefore, a fine plating resist can be formed by the semi-additive process with high precision, and also the residue is hard to occur when the seed layer 44 and the Ni—Cu alloy layer 42 are etched. As a result, the fine second wiring layer 40 can be formed with good yield.

As described above, in the method of manufacturing the wiring substrate of the present embodiment, when the laminated body in which the Ni—Cu alloy layer 42 is formed on the insulating resin layer 30 is formed on the first wiring layer 20 (FIG. 3C), either the method of depositing the Ni—Cu alloy layer 42 by the sputter method, or the like after the insulating resin layer 30 is formed, or the method of pasting the film with Ni—Cu alloy layer F may be applied.

Also, when the desmear process is applied to the inside of the via hole VH (FIG. 4B), either the method of using the wet process, or the method of using the dry process may be applied.

Besides, when the seed layer 44 is formed by the semi-additive process (FIG. 5A), either the method of using the sputter, or the method of using the electroless plating may be applied.

Any combination of two methods out of these three steps can be employed. Eight types of manufacturing methods can be performed in total.

Here, as described above, the Ni—Cu alloy layer 42 is formed on the insulating resin layer 30 as the protection adhesive layer. But a nickel (Ni) layer, a tantalum (Ta) layer, or a titanium (Ti) layer can be used instead of the Ni—Cu alloy layer 42.

Also in the case that the Ni layer, the Ta layer, or the Ti layer is employed, the Ni layer, the Ta layer, or the Ti layer can be left as the adhesion layer in the above-mentioned step (FIG. 4C) of etching the connection pad (Cu) of the first wiring layer 20. This is because an etching rate of the Ni layer, the Ta layer, or the Ti layer is lower than that of the Cu layer.

However, in the case that the Ni layer, the Ta layer, or the Ti layer is employed, the Ni layer, the Ta layer, or the Ti layer can not be sufficiently etched by the etchant used for the Cu layer (the sulfuric acid/hydrogen peroxide mixture) in the step of etching the seed layer 44 by the semi-additive process (FIG. 5C). Therefore, it is possible that the etchant is changed after the seed layer 44 (Cu) is etched, then the Ni layer, the Ta layer, or the Ti layer is etched.

Accordingly, in the case that the Ni layer, the Ta layer, or the Ti layer is employed, the etching step becomes more complicated than the case where the Ni—Cu alloy layer 42 is employed, and it acts disadvantageously in the respect of the production efficiency.

As depicted in FIG. 6, in the wiring substrate 1 of the present embodiment, the penetration electrode 12 is formed in the core substrate 10, and the first wiring layer 20 formed on both surface sides of the core substrate 10 is connected mutually via the penetration electrode 12.

The insulating resin layer 30 covering the first wiring layer 20 is formed on the upper surface side of the core substrate 10. The via hole VH reaching the connection pad P of the first wiring layer 20 is formed in the insulating resin layer 30.

The second wiring layer 40 connected to the connection pad P of the first wiring layer 20 via the via hole VH (via conductor) is formed on the insulating resin layer 30.

The second wiring layer 40 arranged in the via hole VH is formed to include the Ni—Cu alloy layer 42 arranged in the part except the via hole VH and formed from the outer periphery of the via hole VH onto the insulating resin layer 30 located on its outside, the seed layer 44 extended from the inner surface of the via hole VH onto the Ni—Cu alloy layer 42, and the metal plating layer 46 formed on the seed layer 44 and filled in the via hole VH.

The second wiring layer 40 arranged on the insulating resin layer 30 is formed by the Ni—Cu alloy layer 42, the seed layer 44, and the metal plating layer 46 in sequence from the bottom.

Also, the concave portion 20a formed by the etching is provided in the surface of the first wiring layer 20 at the bottom part of the via hole VH. As explained in the above manufacturing method, a thickness of the Ni—Cu alloy layer 42 is set thinner than a depth of the concave portion 20a of the first wiring layer 20. Accordingly, as depicted in a partial enlarged sectional view of FIG. 6, a thickness T of the Ni—Cu alloy layer 42 being left finally also is set thinner than a depth D of the concave portion 20a of the first wiring layer 20.

As depicted in a partial enlarged plan view (1) of FIG. 6, in the case that the second wiring layer 40 has a pad portion 40a arranged on and around the via hole VH and an extended wiring portion 40b connected to this pad portion 40a and extended outward from there, the Ni—Cu alloy layer 42 is arranged in respective areas of the pad portion 40a (outer peripheral part of the via hole VH) except the via hole VH and the extended wiring portion 40b as their lowest layers (hatched part).

Alternatively, as depicted in a partial enlarged plan view (2) of FIG. 6, in the case that the second wiring layer 40 is arranged on the via hole VH as the island-like pad portion 40a, the Ni—Cu alloy layer 42 is arranged in the area of the pad portion 40a except the via hole VH like a ring as its lowest layer (hatched part).

In this way, the Ni—Cu alloy layer 42 is formed on the insulating resin layer 30 with a predetermined pattern as the lowest layer of the second wiring layer 40.

In the partial enlarged plan views (1) and (2) of FIG. 6, only the via hole VH and the second wiring layer 40 are depicted schematically.

Further, the solder resist 34 in which the opening portion 34a is provided on respective connection parts of the first wiring layer 20 and the second wiring layer 40 is formed on both surface sides of the core substrate 10 respectively. Also, the contact layer C formed of the Ni/Au plating layer, or the like is formed on respective connection parts.

As described above, the Ni—Cu alloy layer 42 can be formed on the smooth insulating resin layer 30 with good adhesion by the sputter method or the vapor deposition method. Then, an etching rate of the Ni—Cu alloy layer 42 using the etchant (the sulfuric acid/hydrogen peroxide mixture) for the Cu layer is lower than an etching rate of the Cu layer. Therefore, even when the connection pad P of the first wiring layer 20 is etched after the via hole VH is formed, the Ni—Cu alloy layer 42 can be left as the adhesive layer.

Also, a certain level of the etching rate of the Ni—Cu alloy layer 42 can be obtained by the etchant (the sulfuric acid/hydrogen peroxide mixture) using for the Cu layer. Therefore, the Ni—Cu alloy layer 42 can be etched simultaneously when the seed layer 44 (Cu) is etched by the semi-additive process.

In this manner, in the wiring formation using the semi-additive process, the Ni—Cu alloy layer 42 is arranged under the seed layer 44 as the adhesive layer. As a result, the fine second wiring layer 40 can be formed on the insulating resin layer 30 in a good adhesive condition not to roughen the surface of the insulating resin layer 30. A surface roughness (Ra) of the insulating resin layer 30 is 10 to 200 nm, and the insulating resin layer 30 is kept in a smooth state.

Figure 7:
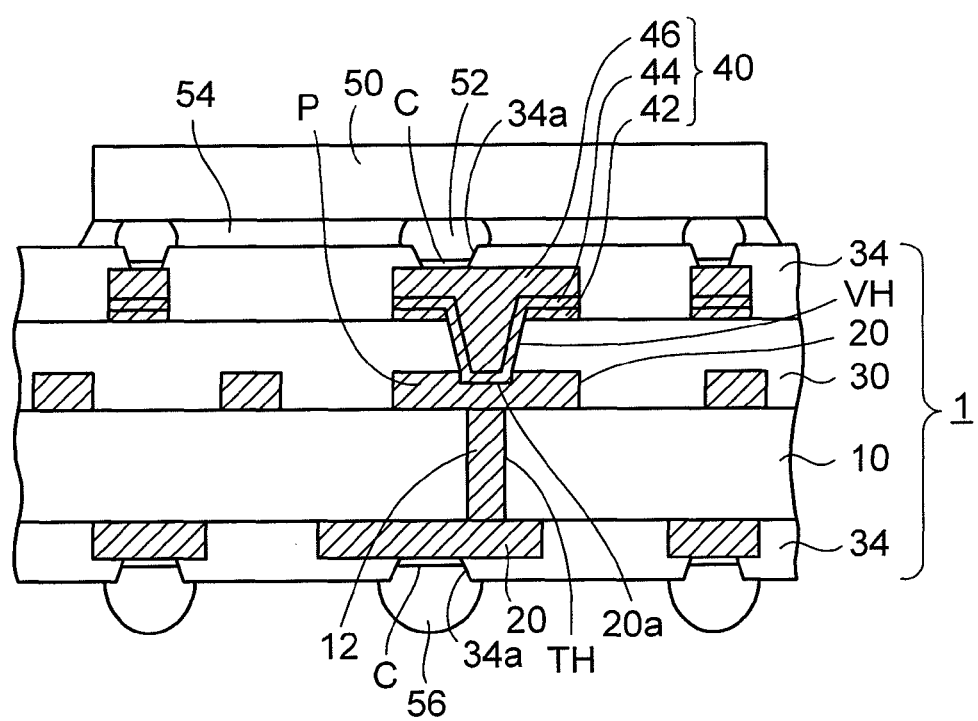
FIG. 7 is a sectional view depicting a state that a semiconductor chip is mounted on the wiring substrate according to the embodiment.

In FIG. 7, a state in which a semiconductor chip is mounted on the wiring substrate in FIG. 6 is depicted.

In an example in FIG. 7, a semiconductor chip 50 (LSI chip) is flip-chip connected to the contact layers C of the second wiring layers 40 on the upper surface side by bump electrodes 52 such as solder, or the like. Then, an underfill resin 54 is filled in a clearance located under the semiconductor chip 50. Then, external connection terminals 56 are provided by mounting the solder ball on the contact layers C of the first wiring layers 20 on the lower surface side, or the like.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
    a first wiring layer formed of copper;
    an insulating resin layer formed on the first wiring layer;
    a via hole formed in the insulating resin layer, and reaching the first wiring layer; and
    a second wiring layer including a nickel copper alloy layer arranged in a part except the via hole and formed on the insulating resin layer located outside an outer periphery of the via hole, a seed layer extended from an inner surface of the via hole onto the nickel copper alloy layer, the seed layer formed of copper, and a metal plating layer formed on the seed layer in a state that the metal plating layer is filled in the via hole;
    wherein the nickel copper alloy layer is formed on the insulating resin layer with a predetermined pattern, and a concave portion is formed in the first wiring layer at a bottom part of the via hole, and a nickel content rate of the nickel copper alloy layer is set in a range of between 20 wt % and 50 wt %, thereby the nickel copper alloy layer has a characteristic that an etching rate of the nickel copper alloy layer in a wet etching is lower than an etching rate of the first wiring layer formed of copper, and
    a thickness of the nickel copper alloy layer is set thinner than a depth of the concave portion of the first wiring layer.

2. A wiring substrate according to claim 1, wherein a surface roughness (Ra) of the insulating resin layer is set in a range of between 10 nm and 200 nm.

* * * * *